United States Patent
Jalilizeinali et al.

(10) Patent No.: US 8,040,645 B2
(45) Date of Patent: Oct. 18, 2011

(54) SYSTEM AND METHOD FOR EXCESS VOLTAGE PROTECTION IN A MULTI-DIE PACKAGE

(75) Inventors: Reza Jalilizeinali, Oceanside, CA (US); Sreeker Dundigal, San Diego, CA (US); Vivek Mohan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 461 days.

(21) Appl. No.: 12/190,158

(22) Filed: Aug. 12, 2008

(65) Prior Publication Data

US 2010/0039740 A1 Feb. 18, 2010

(51) Int. Cl.
*H02H 9/00* (2006.01)
(52) U.S. Cl. ......................................................... 361/56
(58) Field of Classification Search ...................... 361/56
See application file for complete search history.

(56) References Cited

U.S. PATENT DOCUMENTS

| | | | | |
|---|---|---|---|---|
| 5,412,593 A * | 5/1995 | Magel et al. | | 365/96 |
| 5,654,862 A | 8/1997 | Worley et al. | | |
| 5,796,171 A * | 8/1998 | Koc et al. | | 257/786 |
| 5,946,177 A | 8/1999 | Miller et al. | | |
| 6,160,420 A * | 12/2000 | Gamal et al. | | 326/41 |
| 6,327,126 B1 | 12/2001 | Miller et al. | | |
| 6,686,768 B2 * | 2/2004 | Comer | | 326/38 |
| 6,813,130 B2 | 11/2004 | Miyaba | | |
| 7,196,890 B2 | 3/2007 | Smith | | |
| 7,312,517 B2 | 12/2007 | Hirata | | |
| 7,399,660 B2 | 7/2008 | Fujito et al. | | |
| 7,561,390 B2 | 7/2009 | Furuta | | |
| 2006/0250732 A1 | 11/2006 | Peachey | | |

FOREIGN PATENT DOCUMENTS

| | | |
|---|---|---|
| EP | 1427015 A2 | 6/2004 |
| EP | 1701385 A1 | 9/2006 |

OTHER PUBLICATIONS

International Search Report & Written Opinion—PCT/US2009/053548, International Search Authority—European Patent Office—Nov. 11, 2009.

* cited by examiner

*Primary Examiner* — Stephen W Jackson
(74) *Attorney, Agent, or Firm* — Michelle Gallardo; Nicholas J. Pauley; Jonathan Velasco (57) ABSTRACT

A protection system implemented on one die of a multi-die package provides a discharge path for excess voltages incurred on one or more other die of the package. Ground paths are provided for certain circuitry in the package that have high noise-sensitivity, and ground paths are provided for certain circuitry in the package that have low noise-sensitivity relative to the high noise-sensitivity circuitry. The grounds of high noise-sensitivity circuitry of multiple die are shorted together, resulting in a common high noise-sensitivity ground. The grounds of low noise-sensitivity circuitry of multiple die are shorted together, resulting in a common low noise-sensitivity ground. A pre-designated removable path is included on the package external to the die, which shorts the common high noise-sensitivity ground and the common low noise-sensitivity ground. The removable path may be removed during manufacturing, if noise present on the shorted grounds results in unacceptable performance degradation.

25 Claims, 4 Drawing Sheets

SYSTEM AND METHOD FOR EXCESS VOLTAGE PROTECTION IN A MULTI-DIE PACKAGE

TECHNICAL FIELD

The following description relates generally to semiconductor circuits providing protection against potentially damaging excess voltages, including as examples excess voltages resulting from electrical overstress (EOS) and/or electrostatic discharge (ESD) events.

BACKGROUND

Modern integrated circuits (ICs) are easily damaged by excess voltages. Common sources of these potentially damaging voltages include electrical overstress (EOS) and electrostatic discharge (ESD). ESD, a serious issue in solid state electronics, is a transfer of electrostatic charge between bodies or surfaces at different electrostatic potentials either through direct contact or through an induced electrical field. ICs which are built using semiconductors, such as silicon, and insulating materials, such as silicon dioxide, can be permanently damaged when subjected to higher voltages that may be produced by ESD events.

Traditionally, on-chip circuits are employed to protect the IC during an ESD event. In conventional IC ESD protection schemes, special clamp circuits are often used to shunt ESD current between the IC power supply rails and thereby protect sensitive internal elements of the IC from damage. Such clamping circuits typically have a timer circuit (e.g., a resistor-capacitor (RC) timer, which may be referred to as a "transient detector") and a large n-channel MOSFET device for discharging the high ESD current. Thus, a power rail clamp circuit is often employed within an IC so that if an ESD event is encountered on the IC's power rail, the clamp will turn on and reduce the voltage so that the IC's main devices (circuitry elements) will not get damaged. Implementations and use of such RC clamps are well-known in the art.

Exemplary ESD protection circuits include those described in U.S. Pat. No. 5,946,177 titled "Circuit for Electrostatic Discharge Protection", U.S. Pat. No. 6,327,126 titled "Electrostatic Discharge Circuit", U.S. Pat. No. 7,196,890 titled "Electrostatic Discharge Protection Power Rail Clamp with Feedback-Enhanced Triggering and Conditioning Circuitry", U.S. Pat. No. 5,654,862 titled "Method and Apparatus for Coupling Multiple Independent On-Chip VDD Busses to ESD Core Clamp", and Published U.S. Patent Application No. 2006/0250732 titled "Transient Pulse, Substrate-Triggered BICMOS Rail Clamp For ESD Abatement."

A given integrated circuit (IC) package may have multiple die implemented therein. Traditionally, there are on-chip ESD protection circuits which are integrated into the input/output (I/O) circuits to protect a given die during an ESD discharge event. These circuits provide the required protection for that particular die. Thus, in traditional ESD protection schemes for IC packages including multiple die, an ESD protection circuit may be implemented within each die for protecting its particular die against excess voltage events (e.g., ESD events) that arise within the particular die. As an example, an ESD protection circuit may have a pair of back-to-back diodes that are arranged within a given die for providing a discharge path for excess voltage events that arise within the given die. Similarly, another pair of back-to-back diodes may be arranged within another die for providing a discharge path for excess voltage events that arise within such other die. Such utilization of back-to-back diodes for providing an excess voltage discharge path is well-known in the art. In general, such diodes are usually reverse-biased (non-conducting) under normal operating conditions, but upon an excess voltage event (e.g., ESD) occurring which causes an excess charge on one side of the diode pair exceeding some threshold amount, a diode in the pair becomes forward-biased (conducting) so as to provide a discharge path for the excess voltage.

In a package that has multiple die, the I/O signals of one die may communicate with I/O signals of one or more other die in the same package. Different die in the package may have different levels of sensitivity to noise. For instance, these die in a given package may contain completely digital circuits or RF/analog circuits, which are highly sensitive to substrate noise and cross talk. Typically, if a die contains circuitry that is highly sensitive to noise (e.g., sensitive RF/analog circuits), it requires proper isolation from the substrate noise which may be introduced by another die, such as by a digital die in the package.

ESD protection for an overall package containing multiple die becomes more challenging due to such problems as noise isolation, cross talk, etc. Moreover, the communication between multiple die and the signals which interface between different power domains adds to the ESD vulnerability of the package.

SUMMARY

In view of the above, a desire exists for an excess voltage protection system for an IC package containing multiple die. A desire exists for such an excess voltage protection system that provides the IC package with good immunity to potentially damaging excess voltage events (e.g., ESD events). A desire exists for such an excess voltage protection system that is able to discharge the transient current during such a potentially damaging excess voltage event without stressing any of the devices in the package. The overall ESD scheme should be robust.

The present disclosure is directed generally to systems and methods for providing protection against potentially damaging excess voltage events (e.g., ESD events) for a multi-die package. According to certain embodiments of the present invention, an excess voltage protection system that is implemented on one die of the multi-die package provides a discharge path for excess voltages incurred on one or more other dies of the IC package.

In an embodiment, an excess voltage discharge system includes an integrated circuit (IC) package having a first die and a second die. The first die has a first ground node, a second ground node, and protection circuitry interposed between the first ground node and second ground node. The second die has a third ground node and a fourth ground node. The third ground node is shorted to the first ground node to result in a first cross-die common ground. The fourth ground node is shorted to the second ground node to result in a second cross-die common ground. The system also includes a pre-designated removable path for shorting the first cross-die common ground and the second cross-die common ground together at a location on the package external to the first die and second die.

In another embodiment, an excess voltage discharge system includes a integrated circuit (IC) package having a first die coupled to a second die. The first die has digital circuitry and radio frequency (RF) analog circuitry. The first die also has a protection system that creates a common discharge path for the second die.

In yet another embodiment, an excess voltage discharge system includes an integrated circuit (IC) package having a first die and at least a second die. The first die has first circuitry and second circuitry, the first circuitry of the first die having high noise-sensitivity relative to the second circuitry. The first die has at least one high noise-sensitivity ground node for the first circuitry on the first die, and at least one low noise-sensitivity ground node for the second circuitry on the first die. The first die also has protection circuitry interposed between the at least one high noise-sensitivity ground node and the at least one low noise-sensitivity ground node. The at least a second die has third circuitry and fourth circuitry, the third circuitry of the at least a second die having high noise-sensitivity relative to the fourth circuitry. The at least a second die has at least one high noise-sensitivity ground node for the third circuitry, and at least one low noise-sensitivity ground node for the fourth circuitry. The at least one high noise-sensitivity ground node of the first die and the at least one high noise-sensitivity ground node of the at least a second die are shorted together, at a location on the package external to the first die and the at least a second die, to result in a common high noise-sensitivity ground. The at least one low noise-sensitivity ground node of the first die and the at least one low noise-sensitivity ground node of the at least a second die are shorted together, at a location on the package external to the first die and the at least a second die, to result in a common low noise-sensitivity ground. A pre-designated removable path is for shorting the common high noise-sensitivity ground and the common low noise-sensitivity ground together at a location on the package external to the first die and the at least a second die.

In still another embodiment, a method is provided for manufacturing a multi-die integrated circuit (IC) package. The method includes shorting high noise-sensitivity grounds of multiple die of the multi-die package together to result in a common high noise-sensitivity ground path on the multi-die package that is external to the multiple die. The method also includes shorting low noise-sensitivity grounds of multiple die of the multi-die package together to result in a common low noise-sensitivity ground path on the multi-die package that is external to the multiple die. The method further includes providing excess voltage discharge protection circuitry on at least one of the multiple die. The common high noise-sensitivity ground path and the common low noise-sensitivity ground path are coupled to the excess voltage discharge protection circuitry. The method also includes providing a pre-designated removable path on the multi-die package that shorts the common high noise-sensitivity ground path and the common low noise-sensitivity ground path together. The method further includes evaluating performance of the multi-die package with the pre-designated optional path shorting the common high noise-sensitivity ground path and the common low noise-sensitivity ground path together; and if performance is unacceptable, then cutting the pre-designated removable path so that the common high noise-sensitivity ground path and the common low noise-sensitivity ground path are not shorted together.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
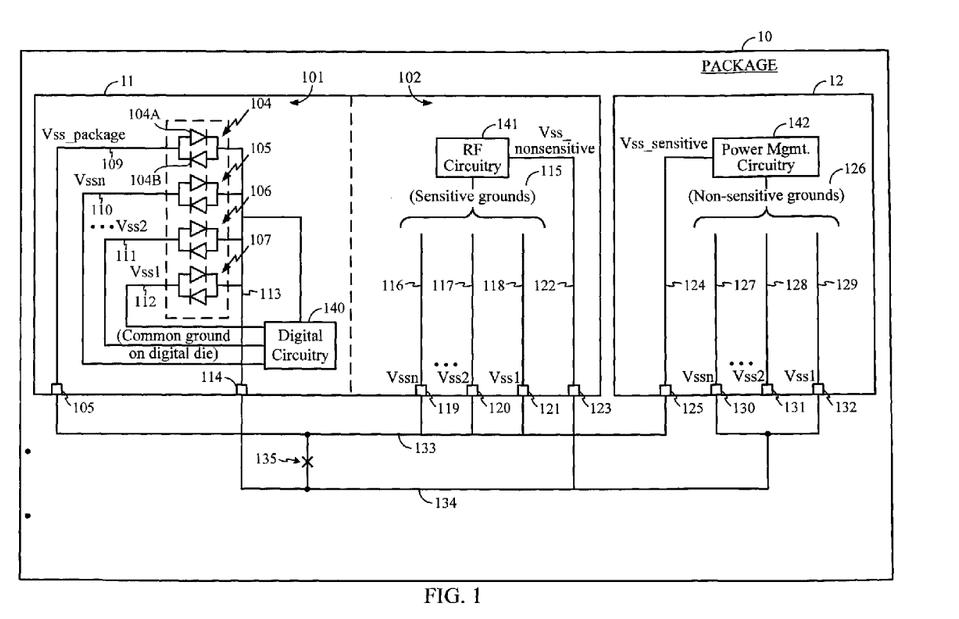
FIG. 1 shows a schematic diagram of an exemplary multi-die package that includes excess voltage (e.g., ESD) protection circuitry according to one embodiment of the present invention.

FIG. 1 shows a schematic diagram of an exemplary multi-die package that includes excess voltage (e.g., ESD) protection circuitry according to one embodiment of the present invention. In the exemplary embodiment of FIG. 1, multi-die package 10 comprises a first die 11 and a second die 12. While two die are shown in this example for ease of illustration, it should be understood that in other embodiments more than two die may be implemented within the multi-die package 10. In this example, first die 11 has first portion 101 and second portion 102. In certain embodiments, first portion 101 includes digital circuitry 140, and second portion 102 includes analog circuitry 141 such as radio frequency (RF) circuitry. For instance, digital circuitry 140 may include such digital circuitry as a processor and memory, as examples. Analog circuitry 141 may include such analog circuitry as RF, LNAs, high frequency DACs, ADCs, PLLs, power management circuitry, as examples. As discussed further herein, the first portion 101 has circuitry having low noise-sensitivity (e.g., digital circuitry 140, or any other type of circuitry with low noise-sensitivity, as discussed further herein), whereas the second portion 102 has circuitry having high noise-sensitivity (e.g., RF analog circuitry 141, or any other type of circuitry with high noise-sensitivity, as discussed further herein).

In general, certain types of circuitry have low noise-sensitivity (i.e., have performance that is less sensitive to noise), while other types of circuitry have high noise-sensitivity (i.e., have performance that is more sensitive to noise). As described further herein, the respective sensitivity to noise is a relative characteristic of the circuitry. For instance, if the noise is great enough, the performance of almost any circuitry may be impacted by it. However, those of ordinary skill in the art will recognize that certain circuitry has relatively high noise-sensitivity, while other circuitry has relatively low noise-sensitivity.

As an example, within a given system, such as within a given IC package (e.g., package 10), there may exist a first type of circuitry that has high noise-sensitivity, and there may exist a second type of circuitry that, relative to the first type of circuitry, has low noise-sensitivity. For instance in the illustrated example of FIG. 1, RF analog circuitry 141 on first die 11 of IC package 10 may be a first type of circuitry that has high noise-sensitivity, while digital circuitry 140 on first die 11 may be a second type of circuitry that, relative to the RF analog circuitry 141, has low noise-sensitivity.

Circuitry that is referred to herein as having low noise-sensitivity is generally circuitry that can endure a greater amount of noise (without having an unacceptable performance degradation) than circuitry that is referred to herein as having high noise-sensitivity. For instance, as compared to many analog circuitry components, digital circuitry is typically considered as being less sensitive to noise. For example, many digital circuits can recognize a window of voltage levels as being either a high voltage level (or logical "1") or a low voltage level (or logical "0"). As one example, a given digital circuit may define 0 volts as being a low voltage level and 5 volts as being a high voltage level. Further, rather than requiring voltage levels to precisely be either 0 volts or 5 volts to be recognized as a low voltage level or high voltage level, respectively, the given digital circuit may recognize respective windows of voltage levels as corresponding to the low or high levels. For instance, such given digital circuit may recognize any voltage level that is below some threshold amount, say below 1.5 volts, as corresponding to a low voltage level, and it may recognize any voltage level that exceeds some threshold amount, say 3.5 volts, as corresponding to a high voltage level. On the other hand, performance of many analog circuits depends more strictly on a precise value of a signal (or depends upon much tighter windows of signal values than that often permitted by digital circuits). In this way, many digital circuits have a low noise-sensitivity relative to many analog circuits. Of course, other examples of differing types of circuits that have relative differences in their respective sensitivities to noise may exist in a given system, as those of ordinary skill in the art will appreciate.

In the exemplary system of FIG. 1, the first portion 101 of first die 11 includes excess voltage protection circuitry 103, which is described further herein. As shown, the first portion 101 comprises one or more ground paths, such as Vss_package path 109, Vssn path 110, Vss2 path 111, and Vss1 path 112. Each of these ground paths 109-112 is coupled via excess voltage protection circuitry 103 to a common ground path ("Vssx") 113. One or more of the ground paths 109-113 may be used to provide reference ground for digital circuitry 140 implemented on first die 11. In the illustrated example, Vss_package path 109 is exposed external to first die 11 via I/O pad 108. Similarly, the common Vssx path 113 is exposed external to first die 11 via I/O pad 114. Of course, one or more of the other ground paths 110-112 may likewise be exposed external to first die 11 via I/O pads in certain implementations.

In certain embodiments, excess voltage protection circuitry 103 includes one or more pairs of back-to-back diodes, such as the pairs 104, 105, 106, and 107 shown in the exemplary embodiment of FIG. 1. While four pairs of back-to-back diodes are shown in this example, in other implementations any number (one or more) of such pairs may be implemented. Utilization of diodes are well-known in the art, and are thus only briefly mentioned herein. As an example, diode pair 104 is back-to-back arrangement of diodes 104A and 104B. If the voltage present on Vssx 113 exceeds the voltage of Vss_package 109 by an amount greater than the forward breakover of diode 104A, then diode 104A becomes conducting, thus providing a discharge path. On the other hand, if the voltage present on Vss_package 109 exceeds the voltage of Vssx 113 by an amount greater than the forward breakover of diode 104B, then diode 104B becomes conducting, thus providing a discharge path.

In this example, the second portion 102 of first die 11 has one or more high noise-sensitivity ground paths (Vss1 . . . Vssn) 115, which provide reference ground for circuitry in portion 102 (e.g., RF analog circuitry 141) having high noise-sensitivity relative to the circuitry in portion 101 (e.g., digital circuitry 140). Such high noise-sensitivity ground paths 115, in the illustrated example, includes paths 116-118, which are exposed external to first die 11 in this example by I/O pads 119-121, respectively. In the illustrated example, the second portion 102 of first die 11 also includes one or more low noise-sensitivity ground paths, such as low noise-sensitivity ground path 122, which provides reference ground for circuitry in portion 102 that has low noise-sensitivity relative to the circuitry having high noise-sensitivity (e.g., relative to the RF analog circuitry 141). In the illustrated example, such low noise-sensitivity ground path 122 is exposed external to first die 11 by I/O pad 123.

In this example, second die 12 includes power management circuitry 142, but in other embodiments it may include any type of circuitry desired for a given implementation. In this example, the second die 12 has one or more high noise-sensitivity ground paths, such as high noise-sensitivity ground path 124, which provides reference ground for circuitry in second die 12 having high noise-sensitivity relative to circuitry in package 10 (e.g., digital circuitry 140) having low noise-sensitivity. In the illustrated example, such high noise-sensitivity ground path 124 is exposed external to second die 12 by I/O pad 125. Additionally, in the illustrated example, second die 12 has one or more low noise-sensitivity grounds (Vss1...Vssn) 126, which provide reference ground for circuitry in second die 12 having low noise-sensitivity relative to circuitry in package 10 (e.g., RF analog circuitry 141) that has high noise-sensitivity. Such low noise-sensitivity ground paths 126, in the illustrated example, include paths 127-129, which are exposed external to second die 12 in this example by I/O pads 130-132, respectively.

In this exemplary embodiment, all of the high noise-sensitivity grounds of die 11 and 12 are shorted together. More particularly, all of the high noise-sensitivity grounds of die 11 and 12 are shorted together external to the first and second die 11 and 12, thereby resulting in a common high noise-sensitivity ground 133. For instance, as shown in the example of FIG. 1, high noise-sensitivity ground paths 115 of first die 11 and high noise-sensitivity ground 124 of second die 12 are shorted together to result in common high noise-sensitivity ground 133.

Similarly, in this exemplary embodiment, all of the low noise-sensitivity grounds of die 11 and 12 are shorted together on the package. More particularly, all of the low noise-sensitivity grounds of die 11 and 12 are shorted together external to the first and second die 11 and 12, thereby resulting in a common low noise-sensitivity ground 134. For instance, as shown in the example of FIG. 1, low noise-sensitivity ground path 122 of first die 11 and low noise-sensitivity ground paths 126 of second die 12 are shorted together to result in common low noise-sensitivity ground 134.

As also shown in this exemplary embodiment, an optional path 135 is provided for optionally shorting the common high noise-sensitivity ground 133 and the common low noise-sensitivity ground 134 together at a location on the package external to the first die 11 and second die 12. In certain embodiments, as discussed further herein, the optional path 135 is a path (e.g., metal trace) that is initially included in the manufacturing of package 10, but which may be cut (or removed), if so desired, during later manufacturing of the package 10. For instance, as discussed further herein, the path 135 may be a metal trace that is initially included in the package 10. During manufacturing of the package 10, the performance of the circuitry on the die 11 and 12 may be tested to, for example, evaluate the performance of the circuitry having high noise-sensitivity. If it is determined that the performance of the circuitry is acceptable, then the path 135 may be left in place. Otherwise, if the performance is unacceptable (e.g., due to the impact of noise on the circuitry having high noise-sensitivity), then the path 135 can be cut/removed (as indicated by the "X" in FIG. 1)), leaving only the diode protection circuit 103 between the two grounds 133, 134 as an ESD path. As such, the noise incurred by the high noise-sensitivity circuitry may be reduced, if desired for improved performance, by simply cutting path 135 without requiring any alterations to the die 11 and 12.

In this regard, optional path 135 is pre-designated during design and manufacturing as being an optional path. Accordingly, as discussed above, in this exemplary embodiment all of the high noise-sensitivity grounds are shorted together at a location external to die 11 and 12 to result in common high noise-sensitivity ground 133 (which is a trace/path on package 10 that is external to die 11 and 12), and all of the low noise-sensitivity grounds are shorted together at a location external to die 11 and 12 to result in common low noise-sensitivity ground 134 (which also is a trace/path on package 10 that is external to die 11 and 12).

As discussed below, path 135 may be desirable if it does not result in an unacceptable degradation in performance of the high noise-sensitivity circuitry of package 10. If path 135 does result in an unacceptable degradation in performance of the high noise-sensitivity circuitry of package 10, then it can be cut/removed (without any further modification being required to the package 10) to result in a solution that reduces the noise incurred by the high noise-sensitivity circuitry of package 10. When path 135 is cut/removed, the high noise-sensitivity grounds will still have an excess voltage discharge (e.g., ESD discharge) path through the protection system 103 (e.g., back-to-back diodes 104) of the first die 11.

As illustrated in the example of FIG. 1, according to certain embodiments, high noise-sensitivity grounds and low noise-sensitivity grounds are connected together through the excess voltage protection circuitry 103. For instance, the common high noise-sensitivity ground 133 and the common low noise-sensitivity ground 134 are connected together through the excess voltage protection circuitry 103 that is implemented on first die 11 in the exemplary multi-die package of FIG. 1.

While the excess voltage protection circuitry 103 is shown as being implemented in a single die (e.g., die 11) in the example of FIG. 1, in certain embodiments the excess voltage protection circuitry 103 may be implemented on a plurality of different die of the multi-die package. Such implementation across a plurality of different die may be particularly desirable and/or advantageous in multi-die packages that contain many die. While the exemplary multi-die package of FIG. 1 is shown as including two die 11 and 12 for ease of illustration, it should be recognized that in some implementations a multi-die package may include many more die.

Figure 2:
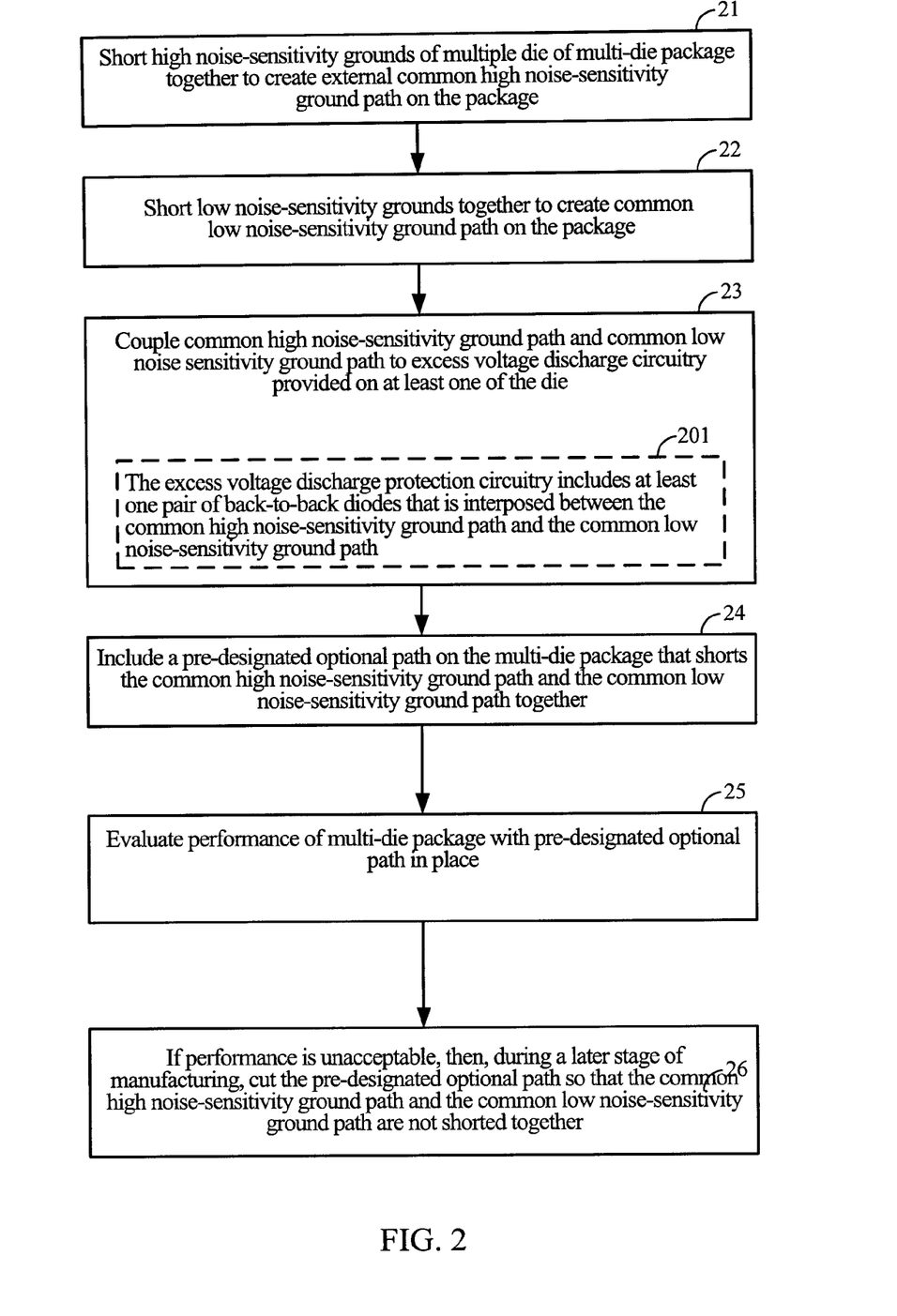
FIG. 2 shows an exemplary process for manufacturing a multi-die package according to one embodiment of the present invention.

Turning to FIG. 2, a process for manufacturing a multi-die package according to one embodiment of the present invention is shown. In block 21 of the manufacturing process, high noise-sensitivity grounds of multiple die of a multi-die package are shorted together to result in a common high noise-sensitivity ground path on the multi-die package that is external to the multiple die. For instance, in the exemplary package 10 of FIG. 1, the high noise-sensitivity grounds of die 11 and 12 are shorted together to result in a common high noise-sensitivity ground path 133 on the multi-die package. The common high noise-sensitivity ground path 133 is external to the multiple die 11 and 12.

In block 22 of the manufacturing process, low noise-sensitivity grounds of multiple die of a multi-die package are shorted together to result in a common low noise-sensitivity ground path on the multi-die package that is external to the multiple die. For instance, in the exemplary package 10 of FIG. 1, the low noise-sensitivity grounds of die 11 and 12 are shorted together to result in a common low noise-sensitivity ground path 134 on the multi-die package. The common low noise-sensitivity ground path 134 is external to the multiple die 11 and 12.

In block 23 of the manufacturing process, an excess voltage discharge protection circuitry (e.g., protection circuitry 103 of FIG. 1) is included on at least one of the multiple die. The common high noise-sensitivity ground path and the common low noise-sensitivity ground path are coupled to the excess voltage discharge protection circuitry. In certain embodiments, as shown in sub-block 201, the excess voltage discharge protection circuitry includes at least one pair of back-to-back diodes that is interposed between the common high noise-sensitivity ground path and the common low noise-sensitivity ground path. For instance, in the exemplary package 10 of FIG. 1, the excess voltage discharge protection circuitry 103 implemented in die 11 includes pair 104 of back-to-back diodes. The pair of back-to-back diodes is interposed between the common high noise-sensitivity ground path 133 and the common low noise-sensitivity ground path 134. That is, the common high noise-sensitivity ground path 133 is communicatively coupled to I/O pad 108 on a first side of the pair of back-to-back diodes, and the common low noise-sensitivity ground path 134 is communicatively coupled to I/O pad 114 on an opposite side of the pair of back-to-back diodes.

In block 24 of the manufacturing process, a pre-designated optional path is included on the multi-die package, wherein the path shorts the common high noise-sensitivity ground path and the common low noise-sensitivity ground path together. Such optional path is preferably implemented at a location on the multi-die package that is external to the multiple die. For instance, as shown in the exemplary package 10 of FIG. 1, pre-designated optional path 135 is initially included (during initial stages of the manufacturing process) on the multi-die package 10. The path 135 shorts the common high noise-sensitivity ground path 133 and the common low noise-sensitivity ground path 134 together.

It should be recognized that the blocks 21-24 may be performed in any relative order and/or one or more of the blocks may be performed in parallel during the manufacturing process.

In block 25 of the manufacturing process, performance of the multi-die package having the path 135 in place (i.e., shorting the common high noise-sensitivity ground path and the common low noise-sensitivity ground path together) is evaluated. As an example, in certain embodiments, the evaluation evaluates whether an unacceptable degradation in performance of circuitry in the multi-die package that has high noise-sensitivity (e.g., RF analog circuitry, etc.) is incurred due to noise present on the common high noise-sensitivity ground path and the common low noise-sensitivity ground path that are shorted together.

Path 135 may generally be desired if it does not result in an unacceptable performance degradation in circuitry of the multi-die package 10. For instance, shorting the common high noise-sensitivity ground path 133 and the common low noise-sensitivity ground path 134 together provides a less resistive path between any of the ground nodes of the multi-die package 10, which may provide better efficiency for handling ESD events (or other excess voltage events) that may arise within the multi-die package 10. Thus, if determined during the evaluation in block 25 that the shorting provided by the pre-designated optional path 135 does not result in an unacceptable performance degradation in circuitry of the multi-die package 10, then the pre-designated optional path 135 may be left in place within the manufactured multi-die package 10.

However, if determined during evaluation in block 25 that the shorting provided by the pre-designated optional path 135 results in an unacceptable performance degradation in circuitry of the multi-die package 10 (e.g., such shorting gives rise to too much noise for the high noise-sensitivity circuitry present within the multi-die package 10), then the pre-designated optional path 135 may, during a later stage of manufacturing, be cut/removed so that the common high noise-sensitivity ground path 133 and the common low noise-sensitivity ground path 134 are not shorted together, as indicated in block 26 of FIG. 2.

Figure 3:
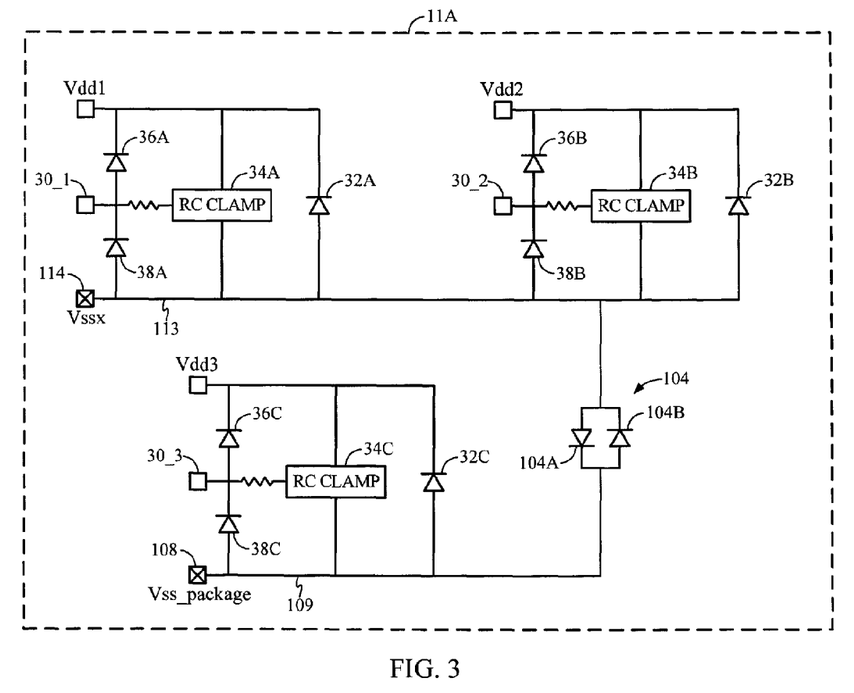
FIG. 3 shows a schematic diagram of at least a portion of a die on a multi-die package that includes excess voltage (e.g., ESD) protection circuitry according to one embodiment of the present invention.

Turning to FIG. 3, a schematic diagram of a portion of first die 11 of multi-die package 10 (of FIG. 1) according to one embodiment of the present invention is shown in greater detail as first die 11A. This schematic diagram shows, in greater detail, an exemplary ESD scheme that may be implemented on die 11 of FIG. 1, according to one embodiment of the present invention. In this example, die 11A includes a first portion of circuitry (e.g., digital circuitry, which is not shown for ease of illustration) that is coupled to an I/O pad 30_1, and which receives a power supply Vdd1 and a reference ground Vssx 113. Two diodes 36A and 38A provide a normal path of discharge going up to the Vdd1. An RC clamp 34A is also included to provide excess voltage discharge between Vdd1 and Vssx 113, and a diode 32A is included to provide a discharge path from Vssx 113 to Vdd1. The arrangement of diodes 36A, 38A, and 32A, and RC clamp 34A is an example of a well-known arrangement for providing excess voltage discharge between Vdd1 and Vssx 113.

Die 11A includes another portion of circuitry (e.g., digital circuitry, which is not shown for ease of illustration) coupled to an I/O pad 30_2, which receives a different power supply Vdd2 and the reference ground Vssx 113. A similar arrangement of diodes 36B, 38B, and 32B, and RC clamp 34B is again employed providing excess voltage discharge between Vdd2 and Vssx 113.

In addition, die 11A includes another portion of circuitry (e.g., digital circuitry, which is not shown for ease of illustration) coupled to an I/O pad 30_3, which receives a different power supply Vdd3 and a different reference ground Vss_package 109 (via I/O pad 108). A similar arrangement of diodes 36C, 38C, and 32C, and RC clamp 34C is again employed providing excess voltage discharge between Vdd3 and Vss_package 109.

Further, back-to-back diode pair 104, which includes diodes 104A and 104B, provides an excess voltage discharge path between Vssx 113 and Vss_package 109 in the manner discussed above with FIG. 1.

While die 11A of FIG. 3 provides a more detailed illustration of an exemplary implementation of the ESD protection scheme that may be employed on a die of multi-die package 10 according to certain embodiments of the present invention, the concepts presented herein are not intended to be limited to the exemplary scheme shown in FIG. 3. Instead, this is merely for illustrative purposes to show that additional ESD protection circuitry (for example, snap back) may be present for I/O pads 30_1, 30_2, and 30_3 of die 11A in addition to the above-described discharge path provided by the back-to-back diode pairs of protection system 103, such as pair 104.

Figure 4:
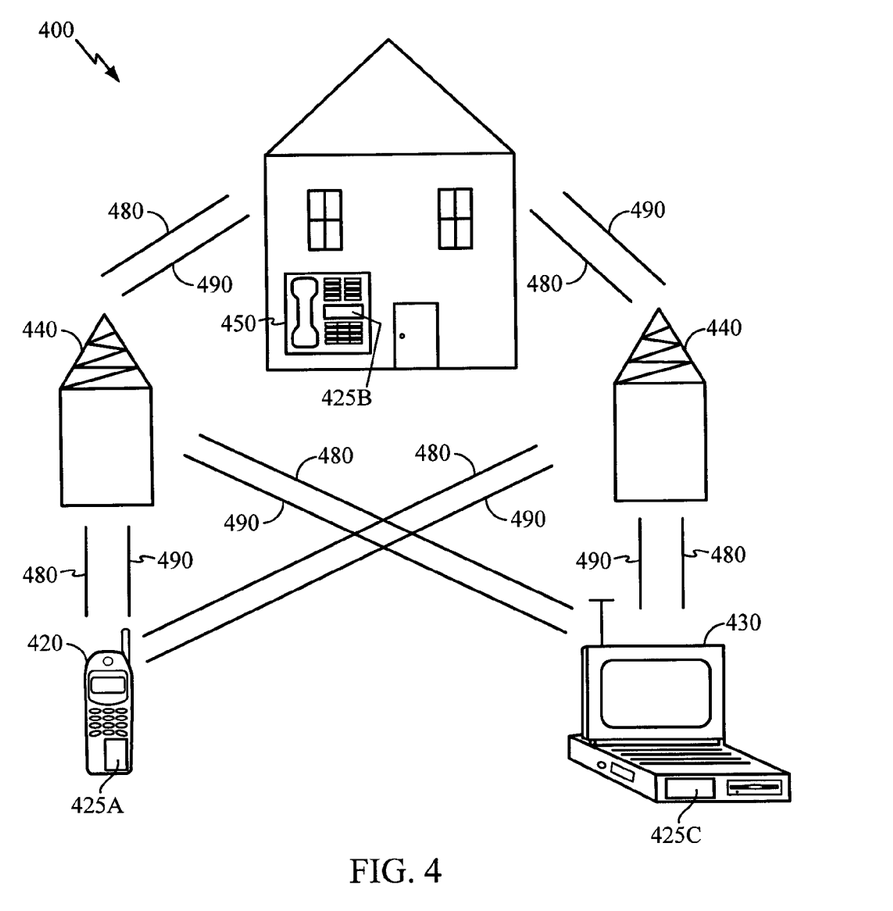
FIG. 4 shows an exemplary wireless communication system in which an embodiment of the invention may be advantageously employed.

FIG. 4 shows an exemplary wireless communication system 400 in which an embodiment of the multi-die package 10 may be advantageously employed. For purposes of illustration, FIG. 4 shows three remote units 420, 430, and 450 and two base stations 440. It will be recognized that typical wireless communication systems may have many more remote units and base stations. Remote units 420, 430, and 450 include the improved ESD solution for a multi-die package 425A, 425B, and 425C, respectively. FIG. 4 shows forward link signals 480 from the base stations 440 and the remote units 420, 430, and 450 and reverse link signals 490 from the remote units 420, 430, and 450 to base stations 440.

In FIG. 4, remote unit 420 is shown as a mobile telephone, remote unit 430 is shown as a portable computer, and remote unit 450 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 4 illustrates remote units, which may employ multi-die packages 10 according to the teachings of the invention, the invention is not limited to these exemplary illustrated units. For instance, the multi-die packages 10 according to embodiments of the present invention may be suitably employed in any device.

Although specific circuitry has been set forth, it will be appreciated by those skilled in the art that not all of the disclosed circuitry is required to practice the invention. Moreover, certain well known circuits have not been described, to maintain focus on the invention. Similarly, although the description refers to logical "0" and logical "1" in certain locations, one skilled in the art appreciates that the logical values can be switched, with the remainder of the circuit adjusted accordingly, without affecting operation of the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An excess voltage discharge system comprising:
   an integrated circuit (IC) package comprising a first die and a second die,
   the first die comprising a first ground node and a second ground node;
   the first die further comprising protection circuitry interposed between the first ground node and second ground node;
   the second die comprising a third ground node and a fourth ground node;
   wherein the third ground node is shorted to the first ground node to result in a first cross-die common ground, and wherein the fourth ground node is shorted to the second ground node to result in a second cross-die common ground; and
   a pre-designated removable path for shorting the first cross-die common ground and the second cross-die common ground together at a location on the package external to the first die and second die.

2. The excess voltage discharge system of claim 1 wherein the pre-designated removable path is initially included during manufacturing of the IC package and is removed during the manufacturing of the package when shorting the first cross-die common ground and the second cross-die common ground together results in undesired performance degradation of the IC package.

3. The excess voltage discharge system of claim 2 wherein the first die comprises first circuitry and second circuitry, the first circuitry having high noise-sensitivity relative to the second circuitry; and wherein the first ground node provides a high noise-sensitivity ground node for the first circuitry, and the second ground node provides a low noise-sensitivity ground node for the second circuitry.

4. The excess voltage discharge system of claim 3 wherein the second die comprises third circuitry and fourth circuitry, the third circuitry having high noise-sensitivity relative to the fourth circuitry; and wherein the third ground node provides a high noise-sensitivity ground node for the third circuitry, and the fourth ground node provides a low noise-sensitivity ground node for the fourth circuitry.

5. An excess voltage discharge system comprising:
   an integrated circuit (IC) package comprising a first die coupled to a second die,
   the first die comprising digital circuitry and radio frequency (RF) analog circuitry; and
   the first die further comprising a protection system that creates a common discharge path for the second die.

6. The excess voltage discharge system of claim 5 wherein the second die comprises power management circuitry.

7. The excess voltage discharge system of claim 5 wherein the protection system comprises at least one pair of back-to-back diodes.

8. The excess voltage discharge system of claim 5 wherein the first die comprises at least one high noise-sensitivity ground node for the RF analog circuitry; wherein the second die comprises at least one high noise-sensitivity ground node for circuitry on the second die having high noise-sensitivity relative to the digital circuitry; and wherein the at least one high noise-sensitivity ground node of the first die and the at least one high noise-sensitivity ground node of the second die are shorted together to result in a common high noise-sensitivity ground.

9. The excess voltage discharge system of claim 8 wherein the at least one high noise-sensitivity ground node of the first die and the at least one high noise-sensitivity ground node of the second die are shorted together at a location on the package external to the first die and second die.

10. The excess voltage discharge system of claim 9 wherein the protection system on the first die provides an excess voltage discharge path for the at least one high noise-sensitivity ground node of the second die.

11. The excess voltage discharge system of claim 9 wherein the first die further comprises at least one low noise-sensitivity ground node for the digital circuitry on the first die; wherein the second die comprises at least one low noise-sensitivity ground node for circuitry on the second die having low noise-sensitivity relative to the RF analog circuitry; and wherein the at least one low noise-sensitivity ground node of the first die and the at least one low noise-sensitivity ground node of the second die are shorted together to result in a common low noise-sensitivity ground.

12. The excess voltage discharge system of claim 11 wherein the at least one low noise-sensitivity ground node of the first die and the at least one low noise-sensitivity ground node of the second die are shorted together at a location on the package external to the first die and second die.

13. The excess voltage discharge system of claim 12 wherein the protection system on the first die provides an excess voltage discharge path interposed between the common high noise-sensitivity ground and the common low noise-sensitivity ground.

14. The excess voltage discharge system of claim 12 further comprising:
   a pre-designated removable path for shorting the common high noise-sensitivity ground and the common low noise-sensitivity ground together at a location on the package external to the first die and second die.

15. An excess voltage discharge system comprising:
   an integrated circuit (IC) package comprising a first die and at least a second die,
   the first die comprising first circuitry and second circuitry, the first circuitry of the first die having high noise-sensitivity relative to the second circuitry;
   the first die comprising at least one high noise-sensitivity ground node for the first circuitry on the first die, and at least one low noise-sensitivity ground node for the second circuitry on the first die;
   the first die further comprising protection circuitry interposed between the at least one high noise-sensitivity ground node and the at least one low noise-sensitivity ground node;
   the at least a second die comprising third circuitry and fourth circuitry, the third circuitry of the at least a second die having high noise-sensitivity relative to the fourth circuitry;
   the at least a second die comprising at least one high noise-sensitivity ground node for the third circuitry, and at least one low noise-sensitivity ground node for the fourth circuitry;
   wherein the at least one high noise-sensitivity ground node of the first die and the at least one high noise-sensitivity ground node of the at least a second die are shorted together, at a location on the package external to the first die and the at least a second die, to result in a common high noise-sensitivity ground;
   wherein the at least one low noise-sensitivity ground node of the first die and the at least one low noise-sensitivity ground node of the at least a second die are shorted together, at a location on the package external to the first die and the at least a second die, to result in a common low noise-sensitivity ground; and a pre-designated removable path for shorting the common high noise-sensitivity ground and the common low noise-sensitivity ground together at a location on the package external to the first die and the at least a second die.

16. The excess voltage discharge system of claim 15 wherein the pre-designated removable path is initially included during manufacturing of the IC package and is removed during the manufacturing of the package when shorting the common high noise-sensitivity ground and the common low noise-sensitivity ground together results in undesired performance degradation of the IC package.

17. The excess voltage discharge system of claim 16 wherein the first circuitry having high noise-sensitivity comprises analog circuitry.

18. The excess voltage discharge system of claim 17 wherein the second circuitry of the first die comprises digital circuitry.

19. The excess voltage discharge system of claim 18 wherein the second die comprises power management circuitry.

20. The excess voltage discharge system of claim 19 wherein upon the pre-designated removable path being removed, the protection circuitry is communicatively interposed between the common high noise-sensitivity ground and the common low noise-sensitivity ground.

21. A method for manufacturing a multi-die integrated circuit (IC) package, the method comprising:
    shorting high noise-sensitivity grounds of multiple die of the multi-die package together to result in a common high noise-sensitivity ground path on the multi-die package that is external to the multiple die;
    shorting low noise-sensitivity grounds of multiple die of the multi-die package together to result in a common low noise-sensitivity ground path on the multi-die package that is external to the multiple die;
    including excess voltage discharge protection circuitry on at least one of the multiple die, wherein the common high noise-sensitivity ground path and the common low noise-sensitivity ground path are coupled to the excess voltage discharge protection circuitry;
    including a pre-designated removable path on the multi-die package that shorts the common high noise-sensitivity ground path and the common low noise-sensitivity ground path together;
    evaluating performance of the multi-die package with the pre-designated optional path shorting the common high noise-sensitivity ground path and the common low noise-sensitivity ground path together; and
    if performance is unacceptable, then cutting the pre-designated removable path so that the common high noise-sensitivity ground path and the common low noise-sensitivity ground path are not shorted together.

22. The method of claim 21 wherein the excess voltage discharge protection circuitry includes at least one pair of back-to-back diodes interposed between the common high noise-sensitivity ground path and the common low noise-sensitivity ground path.

23. The method of claim 21 wherein the evaluating comprises:
    evaluating whether an unacceptable degradation in performance of circuitry in the multi-die package with high noise-sensitivity is incurred due to noise present on the common high noise-sensitivity ground path and the common low noise-sensitivity ground path that are shorted together via the pre-designated removable path.

24. The method of claim 21 wherein the high noise-sensitivity grounds of the multi-die package provide reference grounds for circuitry on the multi-die package that have high noise-sensitivity relative to circuitry on the multi-die package for which the low noise-sensitivity grounds provide reference grounds.

25. The method of claim 24 wherein the circuitry on the multi-die package with high noise-sensitivity comprises analog circuitry, and wherein the circuitry on the multi-die package for which the low noise-sensitivity grounds provide reference grounds comprises digital circuitry.

* * * * *